(12) United States Patent
Dangat

(10) Patent No.: US 6,507,213 B1
(45) Date of Patent: Jan. 14, 2003

(54) PARALLEL CONFIGURATION METHOD AND/OR ARCHITECTURE FOR PLDS OR FPGAS

(75) Inventor: Harish Dangat, Austin, TX (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 09/809,242

(22) Filed: Mar. 15, 2001

(51) Int. Cl.[7] ............................................. H03K 19/177
(52) U.S. Cl. ........................... 326/38; 326/39; 326/40; 326/41; 365/230.03; 365/220; 711/170
(58) Field of Search .................. 326/38–41; 365/230.03, 365/220; 711/170

(56) References Cited

U.S. PATENT DOCUMENTS 4,717,914 A   1/1988  Scott ..................... 340/825.06
5,996,091 A * 11/1999  Jones et al. ................... 714/37
6,031,391 A *  2/2000  Couts-Martin et al. ....... 326/38
6,091,263 A *  7/2000  New et al. ..................... 326/40

OTHER PUBLICATIONS

Anup Nayak et al., "PLD Configuration Architecture", U.S. Ser. No. 09/751,234, Filed Dec. 27, 2000.

Richard L. Stanton et al., "PLD Configuration Port Architecture and Logic", U.S. Ser. No. 09/677,062, Filed Sep. 29, 2000.

* cited by examiner

Primary Examiner—Michael Tokar
Assistant Examiner—Vibol Tan
(74) Attorney, Agent, or Firm—Christopher P. Maiorana, P.C.; Robert M. Miller

(57) ABSTRACT

A programmable logic device comprising a plurality of configuration blocks that may be configured to store configuration information for configuring the programmable logic device. The configuration blocks may be simultaneously programmed.

21 Claims, 3 Drawing Sheets

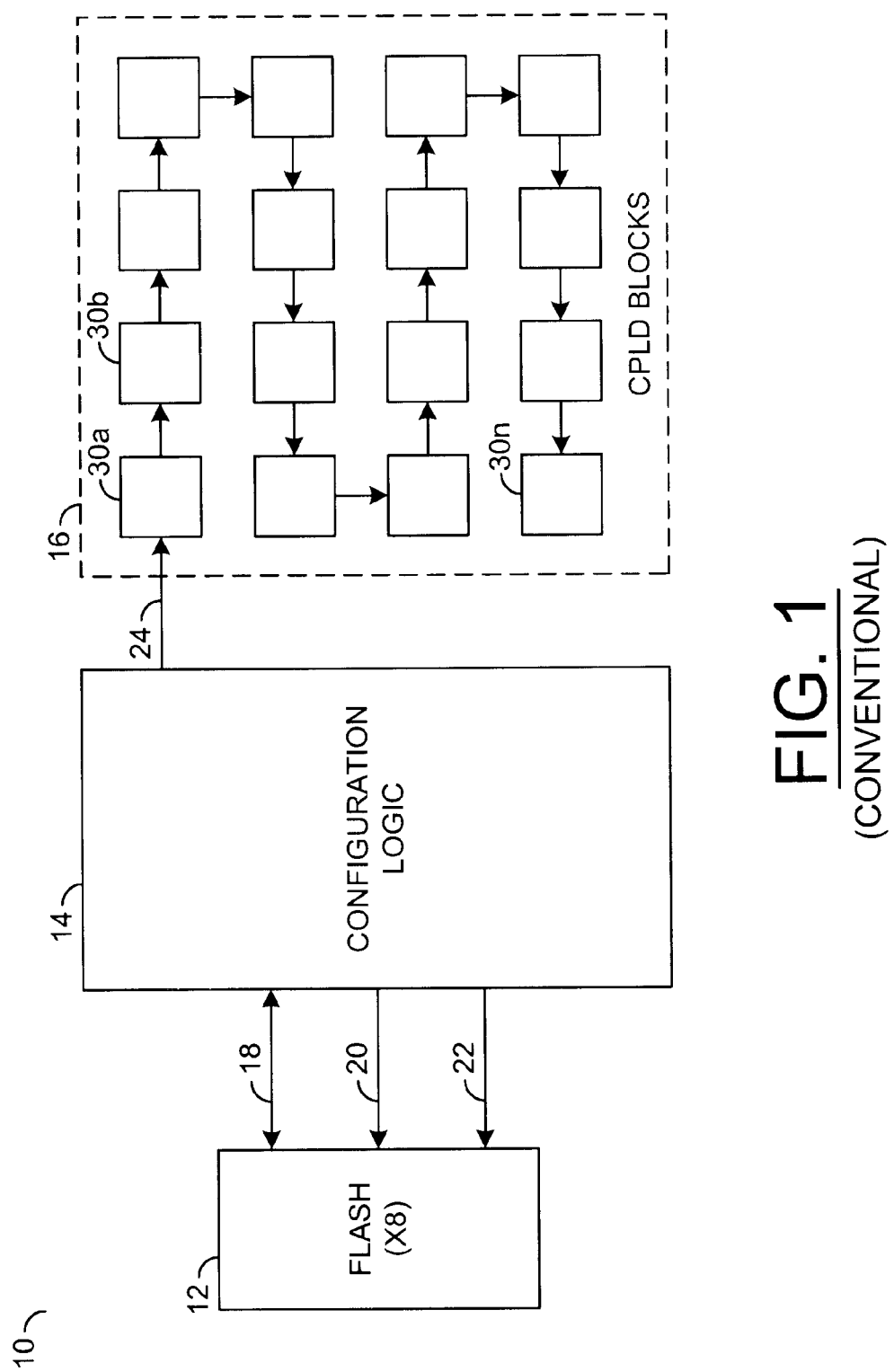
FIG. 1
(CONVENTIONAL)

PARALLEL CONFIGURATION METHOD AND/OR ARCHITECTURE FOR PLDS OR FPGAS

FIELD OF THE INVENTION

The present invention relates to a method and/or architecture for implementing programmable logic devices (PLDs) generally and, more particularly, to a method and/or architecture for implementing a parallel configuration method and/or architecture for complex programmable logic devices (CPLDs) and field programmable gate arrays (FPGAs).

BACKGROUND OF THE INVENTION

A programmable logic device (PLD) provides an economical and efficient means for implementing predetermined Boolean logic functions in an integrated circuit. Such a device consists of, generally, an AND plane configured to generate predetermined product terms in response to a plurality of inputs, a group of fixed/programmable OR gates configured to generate a plurality of sum-of-product(SOP) terms in response to the product terms, and a number of logic elements (i.e., macrocells) configured to generate a desired output in response to the sum-of-products terms. The sum-of-products terms can also be generated using programmable NOR-NOR logic.

The arrangement and operation of components within the PLD are programmed by architecture configuration bits. The architecture configuration bits are set prior to normal operation of the PLD. The bits are set using an operation called "programming" or "configuration". The configuration bits can be stored in volatile memory (i.e., SRAM) or non-volatile memory (i.e., EEPROM/flash). When the configuration bits are stored in volatile memory, the configuration bits need to be loaded from a non-volatile memory, a micro controller, or some other source.

Static Random Access Memory (SRAM) based CPLDs store configuration bits in particular SRAM cells. The configuration information is stored on a separate non-volatile memory. At the time of configuration, the configuration bits are loaded from the non-volatile memory into the CPLD configuration memory cells. Such a configuration process determines the time required to program the CPLD, since the configuration process must be implemented every time the CPLD is either turned on or configured.

Referring to FIG. 1, an example of a system 10 is shown implementing a conventional configuration approach. The system 10 comprises a memory 12, a logic circuit 14 and a CPLD section 16. The memory section 12 is implemented as a low cost memory, such as a flash device. The logic circuit 14 can be a configuration logic circuit that converts configuration information from the flash memory 12 into configuration signals presented to the CPLD section 16. The logic circuit 14 communicates with the memory 12 via a bidirectional data bus 18, an address bus 20 and a control bus 22. The logic 14 presents configuration signals to the CPLD configuration section 16 via a bus 24. The CPLD configuration section 16 is shown implemented as a number of CPLD configuration blocks 30a–30n, where n is an integer.

Conventional approaches serially configure all of the blocks 30a–30n of a CPLD. A first one of the CPLD blocks 30a receives the configuration signal from the bus 24. After the CPLD block 30a is configured, configuration of the CPLD block 30b is started. The configuration continues in such a serial fashion until all of the CPLD blocks 30a–30n are configured. A disadvantages with such an approach is the length of time needed for configuration. As the number of CPLD configuration blocks (and bits) increases, the configuration time also grows.

SUMMARY OF THE INVENTION

The present invention concerns a programmable logic device comprising a plurality of configuration blocks that may be configured to store configuration information for configuring the programmable logic device. The configuration blocks may be simultaneously programmed.

The objects, features and advantages of the present invention include providing a method and/or architecture for implementing a parallel configuration of CPLDs and FPGAs that may (i) configure a number of blocks (e.g., 8 PLD blocks) in parallel, (ii) provide configuration that may be faster (e.g., 8 times faster) than conventional configuration approaches), (iii) reduce system cost by using slower technologies (e.g., flash memory) when a portion of the configuration speed may be sacrificed, and/or (iv) be implemented without additional pads.

BRIEF DESCRIPTION OF THE DRAWINGS

These and other objects, features and advantages of the present invention will be apparent from the following detailed description and the appended claims and drawings in which:

FIG. 1 is a block diagram of a conventional approach for programming a complex programmable logic device;

DETAILED DESCRIPTION OF THE PREFERRED EMBODIMENTS

Figure 2:
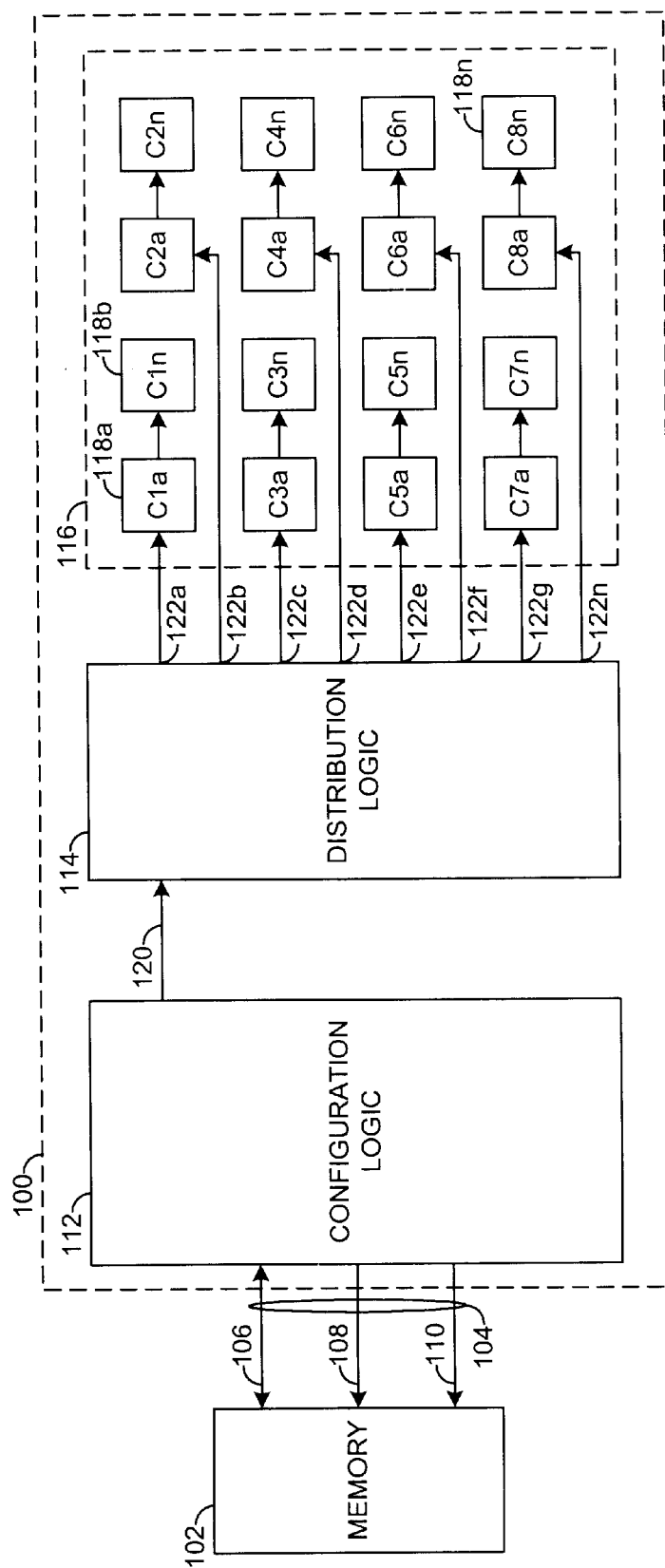
FIG. 2 is a block diagram of a preferred embodiment of the present invention.

Referring to FIG. 2, a block diagram of a circuit 100 is shown in accordance with a preferred embodiment of the present invention. The circuit 100 generally comprises a configuration section of a programmable logic device (PLD). The circuit 100 may be configured, in one example, to retrieve configuration information from a memory 102. The memory 102 may be implemented as a parallel memory, a serial memory or a JTAG port. The memory 102 may be implemented, in one example, as a non-volatile memory. For example, the memory 102 may be implemented as a flash memory. In one example, the memory 102 may be implemented as an 8-bit wide memory. However, a wider memory or multiple memories may be implemented accordingly to meet the design criteria of a particular application.

The memory 102 may be implemented as an external memory. The memory 102 and the PLD may each be implemented on a separate die. The die containing the memory 102 may be mounted, in one example, in the same package as the die containing the PLD. The circuit 100 may be configured to connect with the memory device 102 via an interface 104. The interface 104 may comprise, in one example, a bidirectional bus 106, an address bus 108, and a control bus 110. The interface 104 may be implemented as a parallel interface or a serial interface.

The circuit 100 may comprise a circuit (block) 112, a circuit (block) 114 and a circuit (block) 116. The circuit 112 may be a configuration logic circuit. The circuit 114 may be a distribution logic circuit. The circuit 116 may be a configuration memory portion of the programmable logic device. For example, the circuit 116 may comprise configuration bits of a complex programmable logic device (CPLD) or look-up-tables of a field programmable gate array (FPGA). In one example, the configuration memory portion 116 may comprise a number of configuration blocks 118a–118n, where n is an integer. The configuration blocks 118a–118n may be distributed around a die containing the programmable logic device. The configuration blocks 118a–118n may be implemented with a number of memory elements (e.g., registers, latches, static random access memory, etc.).

The circuit 112 may be configured to retrieve configuration information from the memory 102 or any other device attached to the interface 104. The configuration logic 112 may be configured to decompress and/or decode the configuration information and present the decompressed and/or decoded configuration information to the distribution logic 114. An example of such a configuration logic circuit may be found in a co-pending patent application U.S. Ser. No. 09/677,062, which is hereby incorporated by reference in its entirety. The configuration logic circuit 112 may have an output that may present a number of signals to the distribution logic circuit 114 via the bus 120. The signals carried by the bus 120 may include, but are not limited to, a serial data signal, a serial clock signal and one or more control signals.

The distribution logic 114 may have a number of outputs 122a–122n that may present configuration signals to the configuration block 116. In one example, the number of outputs may be eight. However, other numbers of outputs may be implemented to meet the design criteria of a particular application. The distribution logic 114 may be configured to direct the configuration information received from the configuration logic 112 to the outputs 122a–122n.

The individual configuration blocks 118a–118n may be arranged into a number of groups (sets) equal to the number of outputs 122a–122n of the distribution logic circuit 114. In the example where the number of outputs 122a–122n is eight, the number of groups of configuration blocks 118a–118n is generally eight as well. The configuration blocks 118 contained in a particular set may be connected serially. The circuit 100 may be configured to program the sets of configuration blocks simultaneously (in parallel). As used herein, the term "simultaneously" is meant to describe events that share some common time period. However, the term is not meant to be limited to events that begin at the same point in time, end at the same point in time, or have the same duration. Since the total number of configuration blocks is divided into a number of sets, the time for configuring the PLD 100 may be reduced proportionally to the number of sets.

The number of configuration blocks 118 contained in a set may be the same or different. The distribution logic 114 may be configured to generate control signals for configuring the sets of configuration blocks 118. Alternatively, the configuration blocks 118 may be implemented to automatically configure storage elements in response to global data and global control signals received from the distribution logic 114. An example of such configuration blocks may be found in co-pending application U.S. Ser. No. 09/751,234, which is hereby incorporated by reference in its entirety. The sets of configuration blocks 118 connected to the separate pathways 122a–122n of the distribution logic 114 may be programmed simultaneously. Simultaneous programming of the configuration blocks 118a–118n generally reduces the time needed to initialize or reinitialize the CPLD or FPGA.

Figure 3:
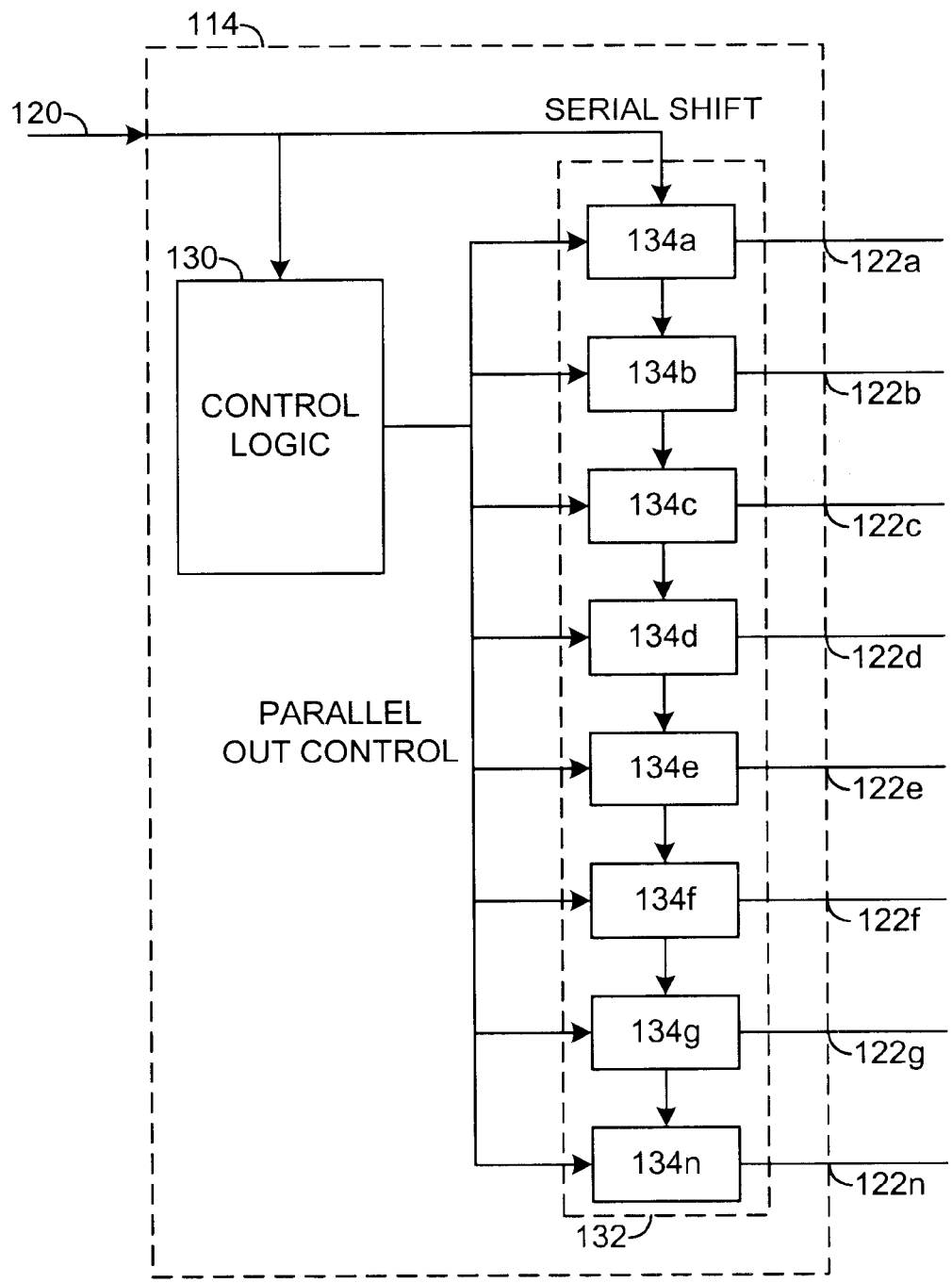
FIG. 3 is a more detailed block diagram of a preferred embodiment of the present invention.

Referring to FIG. 3, a more detailed block diagram of the circuit 114 of FIG. 2 is shown. The circuit 114 may comprise a circuit 130 and a shift register 132. The circuit 130 may be implemented as a control logic for performing a serial to parallel conversion. The shift register 132 may be a serial-in-parallel-out shift register. The shift register 132 may be configured to receive a serial data stream and present a number of parallel data streams in response to control signals generated by the control logic 130. The shift register 132 may comprise a number of elements 134a–134n. In one example, the shift register 132 may contain eight elements. Each of the elements of the shift register 132 may have a first input that may receive one or more signals from the bus 120, a second input that may receive one or more signals from the control logic 130, and an output that may be connected to a corresponding one of the outputs 122a–122n. Any number of outputs (pathways) may be implemented to meet the design criteria of a particular application. However, for convenience, the number of pathways will generally be $2^n$, where n is an integer.

The present invention may be implemented to reduce the time needed to configure CPLDs. For example, the present invention may configure eight sets of configuration blocks simultaneously in a parallel operation. Configuring sets of configuration blocks simultaneously generally reduces the configuration time by a factor of equal to the number of sets. System cost may be reduced by using slower flash memory when configuration speed is not important. In general, the present invention requires no extra pads. However, the present invention may be scaled. For example, more than one flash memory may be used.

While the invention has been particularly shown and described with reference to the preferred embodiments thereof, it will be understood by those skilled in the art that various changes in form and details may be made without departing from the spirit and scope of the invention.

What is claimed is:

1. A programmable logic device comprising:
   a plurality of configuration blocks, each comprising a plurality of memory elements configured to store configuration information for configuring said programmable logic device, wherein (i) two or more of said configuration blocks are simultaneously programmed and (ii) said plurality of configuration blocks are configured as two or more sets of configuration blocks.

2. The programmable logic device according to claim 1, further comprising:
   a logic circuit configured to retrieve said configuration information from an external memory and simultaneously distribute said configuration information among said plurality of configuration blocks.

3. The programmable logic device according to claim 1, wherein said configuration blocks of each set are configured serially.

4. The programmable logic device according to claim 1, wherein each set comprises a similar number of configuration blocks.

5. The programmable logic device according to claim 1, wherein two or more of said sets comprise a different number of configuration blocks.

6. The programmable logic device according to claim 2, wherein said logic circuit comprises:
   a configuration logic circuit configured to (i) retrieve said configuration information, (ii) decompress and/or decode said configuration information, and (iii) generate one or more configuration signals in response to said configuration information.

7. The programmable logic device according to claim 6, wherein said logic circuit further comprises a distribution circuit configured to distribute said configuration signals among said plurality of configuration blocks.

8. The programmable logic device according to claim 7, wherein said distribution circuit comprises a shift register.

9. The programmable logic device according to claim 8, wherein said shift register is a serial-in-parallel-out shift register.

10. The programmable logic device according to claim 8, wherein said distribution circuit further comprises a control logic circuit configured to control said shift register in response to one or more control signals.

11. The programmable logic device according to claim 1, wherein said programmable logic device comprises a complex programmable logic device.

12. The programmable logic device according to claim 1, wherein said programmable logic device comprises a field programmable gate array.

13. A method for reducing configuration time of a programmable logic device comprising the steps of:

receiving configuration information;

generating a plurality of configuration signals in response to said configuration information; and simultaneously programming a plurality of configuration blocks in response to said plurality of configuration signals, wherein each of said configuration blocks comprises a plurality of memory elements configured to store configuration information for configuring said programmable logic device.

14. The method according to claim 13, wherein the receiving step comprises a sub-step of:

decompressing said configuration information.

15. The method according to claim 13, wherein the receiving step comprises a sub-stop of:

decoding the configuration information.

16. The method according to claim 13, wherein the programming step further comprises a sub-step of:

presenting said plurality of configuration signals to said plurality of configuration blocks simultaneously.

17. An apparatus comprising:

means for retrieving configuration information; and means for simultaneously programming a plurality of configuration blocks, wherein said plurality of configuration blocks are configured as two or more sets and each of said configuration blocks comprises a plurality of memory elements configured to store said configuration information to configure a programmable logic device.

18. The apparatus according to claim 17, further comprising:

means for implementing user defined programmable logic in response to said configuration information.

19. A method for reducing configuration time of a programmable logic device comprising the steps of:

receiving configuration information;

decompressing said configuration information; and simultaneously programming a plurality of configuration memory elements configured to store configuration information for configuring said programmable logic device.

20. A method for reducing configuration time of a programmable logic device comprising the steps of:

receiving configuration information;

decoding the configuration information; and simultaneously programming a plurality of configuration memory elements configured to store configuration information for configuring said programmable logic device.

21. The programmable logic device according to claim 2, wherein:

said logic circuit is configured to generate a plurality of configuration signals in response to said configuration information.

* * * * *